(12) United States Patent
Liu (10) Patent No.: US 7,124,808 B2
(45) Date of Patent: Oct. 24, 2006

(54) HEAT DISSIPATION DEVICE

(75) Inventor: Hsiang-Chao Liu, Tao Yuan Shien (TW)

(73) Assignee: Quanta Computer Inc., Tao Yuan Shien (TW)

( * ) Notice: Subject to any disclaimer, the term of this patent is extended or adjusted under 35 U.S.C. 154(b) by 46 days.

(21) Appl. No.: 11/104,265

(22) Filed: Apr. 12, 2005

(65) Prior Publication Data

US 2006/0124278 A1 Jun. 15, 2006

(30) Foreign Application Priority Data

Dec. 14, 2004 (TW) .............................. 93138717 A (51) Int. Cl.
*F28F 3/08* (2006.01)
(52) U.S. Cl. ..................... 165/80.3; 361/704
(58) Field of Classification Search ...... 165/80.1–80.3, 165/185; 361/704
See application file for complete search history.

(56) References Cited

U.S. PATENT DOCUMENTS

| 2,314,089 | A | * | 3/1943 | Hess et al. | .................. 165/144 |
| 3,703,925 | A | * | 11/1972 | Ireland et al. | ............. 165/151 |
| 5,529,120 | A | * | 6/1996 | Howard et al. | ............. 165/166 |
| 5,535,816 | A | * | 7/1996 | Ishida | ........................ 165/80.3 |
| 5,558,155 | A | * | 9/1996 | Ito | ............................. 165/80.3 |

\* cited by examiner

*Primary Examiner*—Teresa J. Walberg
(74) *Attorney, Agent, or Firm*—Thomas, Kayden, Horstemeyer & Risley (57) ABSTRACT

A heat dissipation device includes a plurality of fins connected to each other. Each fin includes a first section with a first surface, a second section with a second surface parallel to the first surface, and a connecting portion. The connecting portion connects the first and second sections and extends along a normal direction thereof. An air passage is formed between the first section and the second section, so that air passes sequentially through the first surface, the air passage and the second surface.

18 Claims, 7 Drawing Sheets

HEAT DISSIPATION DEVICE

BACKGROUND

The invention relates to a heat dissipation device and more particularly, to a heat dissipation device with heat dissipation fins for a computer.

Figure 1:
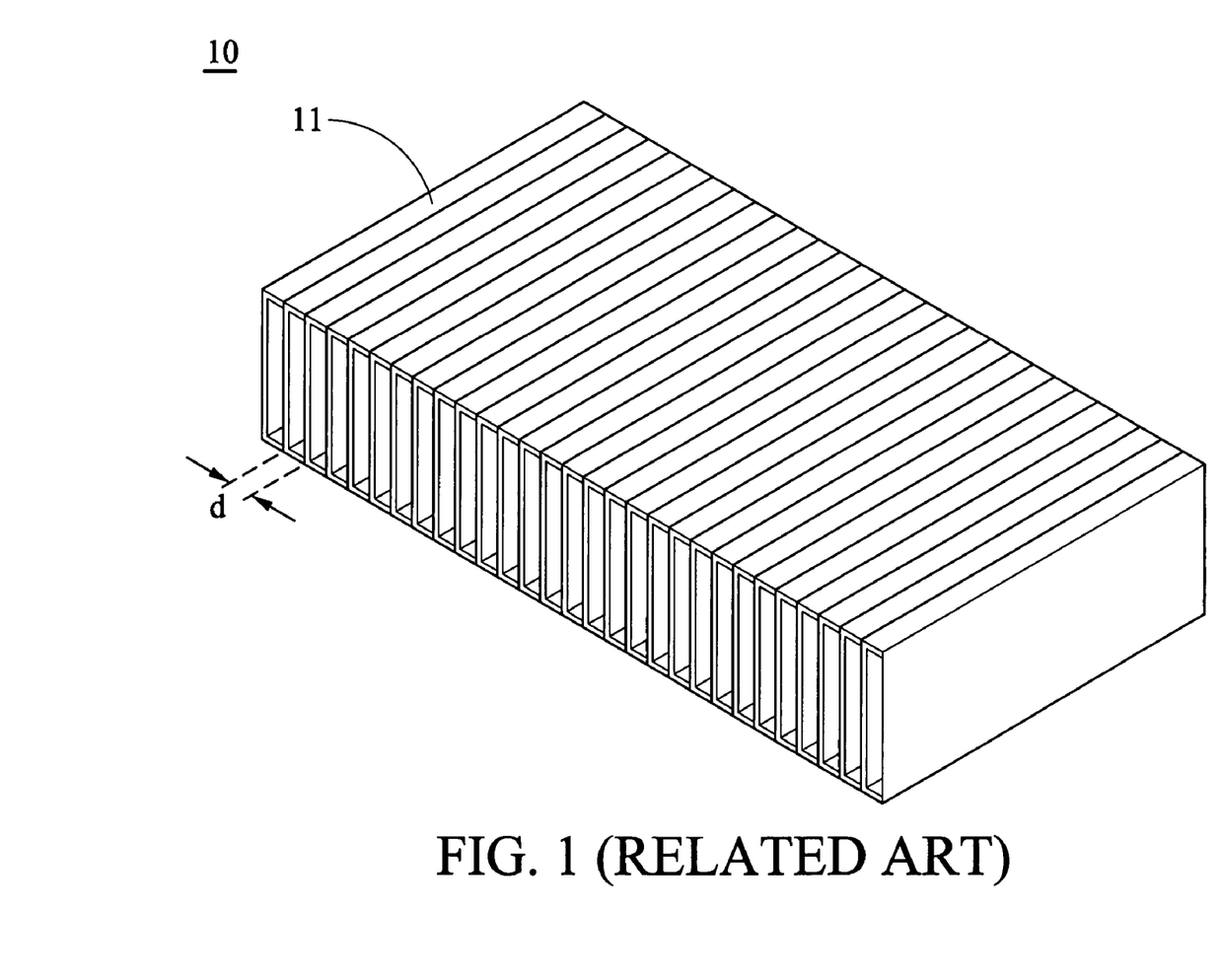
FIG. 1 is a schematic diagram of a conventional heat dissipation device.

FIG. 1 shows a conventional heat dissipation device 10 having a plurality of parallel fins 11. A distance d is maintained between each. According to convention, the distance d is less than 1.0 mm, for matching the safety requirement and preventing entry of foreign material.

However, when the distance d is complies with the standard, the number of fins is very large. For example, if the length of a heat dissipation device 10 is 20 mm, at least 20 fins 11 are required, increasing the overall weight of the device and the resistance of air.

SUMMARY

Accordingly, heat dissipation devices and heat dissipation fins are provided. An exemplary embodiment of a heat dissipation fin comprises a first section, a second section and a connecting portion. The first section has a first surface and the second section has a second surface parallel to the first surface. The first surface and the second surface are at different levels. The connecting portion connects the first and second sections. An air passage is formed on the connecting portion between the first section and the second section so that air passes sequentially through the first surface, the air passage and the second surface.

The heat dissipation fin comprises two connecting portions. An opening is formed between the first section and the second section and air passes sequentially through the first surface, the opening and the second surface.

The connecting portion extends along a normal direction of the first surface.

The heat dissipation fin comprises two flanges respectively connected to the first and second sections. The flanges are substantially perpendicular to the first surface. A distance extends along the normal direction of the first surface between the first and second surfaces, and each flange has a width exceeding the distance, such as twice as the distance.

The heat dissipation fin comprises four flanges respectively connected to the fringes of the first and second sections. Namely, the flanges connect to sides of the first and second sections.

Another exemplary embodiment of a heat dissipation fin comprises a first section, a second section, a third section, a first connecting portion and a second connecting portion. The first section has a first surface, the second section has a second surface, and the third section has a third surface. The first, second, third surfaces are parallel to each other. The first connecting portion connects the first and second sections and extends along a normal direction of the first surface. A first air passage is formed on the first connecting portion and between the first section and the second section. The second connecting portion connects the second and third sections and extends along the normal direction of the first surface. A second air passage is formed on the second connecting portion and between the second section and the third section. Air passes sequentially through the first surface, the first air passage, the second surface, the second air passage and the third surface.

The heat dissipation fin comprises a plurality of flanges respectively connected to the first, second and third sections.

An exemplary embodiment of a heat dissipation device comprises a plurality of heat dissipation fins. Each heat dissipation fin comprises a first section, a second section and a connecting portion. The first section has a first surface and the second section has a second surface parallel to the first surface. The connecting portion connects the first and second sections and extends along a normal direction of the first surface. An air passage is formed between the first section and the second section so that air passes sequentially through the first surface, the air passage and the second surface.

The heat dissipation fins are connected and arranged along the normal direction of the first surface.

Each heat dissipation fin further comprises two connecting portions. An opening is formed between the first section and the second section and the connecting portions. Air passes sequentially through the first section, the opening and the second section.

Each heat dissipation fin comprises four flanges respectively connected to the first and second sections. The flanges are substantially perpendicular to the first surface. A distance extends along the normal direction of the first surface between the first and second surfaces, and each flange has a width exceeding the distance, such as twice as the distance.

Each heat dissipation fin comprises two first flanges and two second flanges. The first flanges are connected to a fringe of the first section, and the second flanges are connected to a fringe of the second section. Meanwhile, the first flanges connect to the first surface of the adjacent heat dissipation fin and the second flanges connect to the second surface of the adjacent heat dissipation fin.

DESCRIPTION OF THE DRAWINGS

The invention can be more fully understood by reading the subsequent detailed description in conjunction with the examples and references made to the accompanying drawings, wherein.

DETAILED DESCRIPTION

Figure 2A:
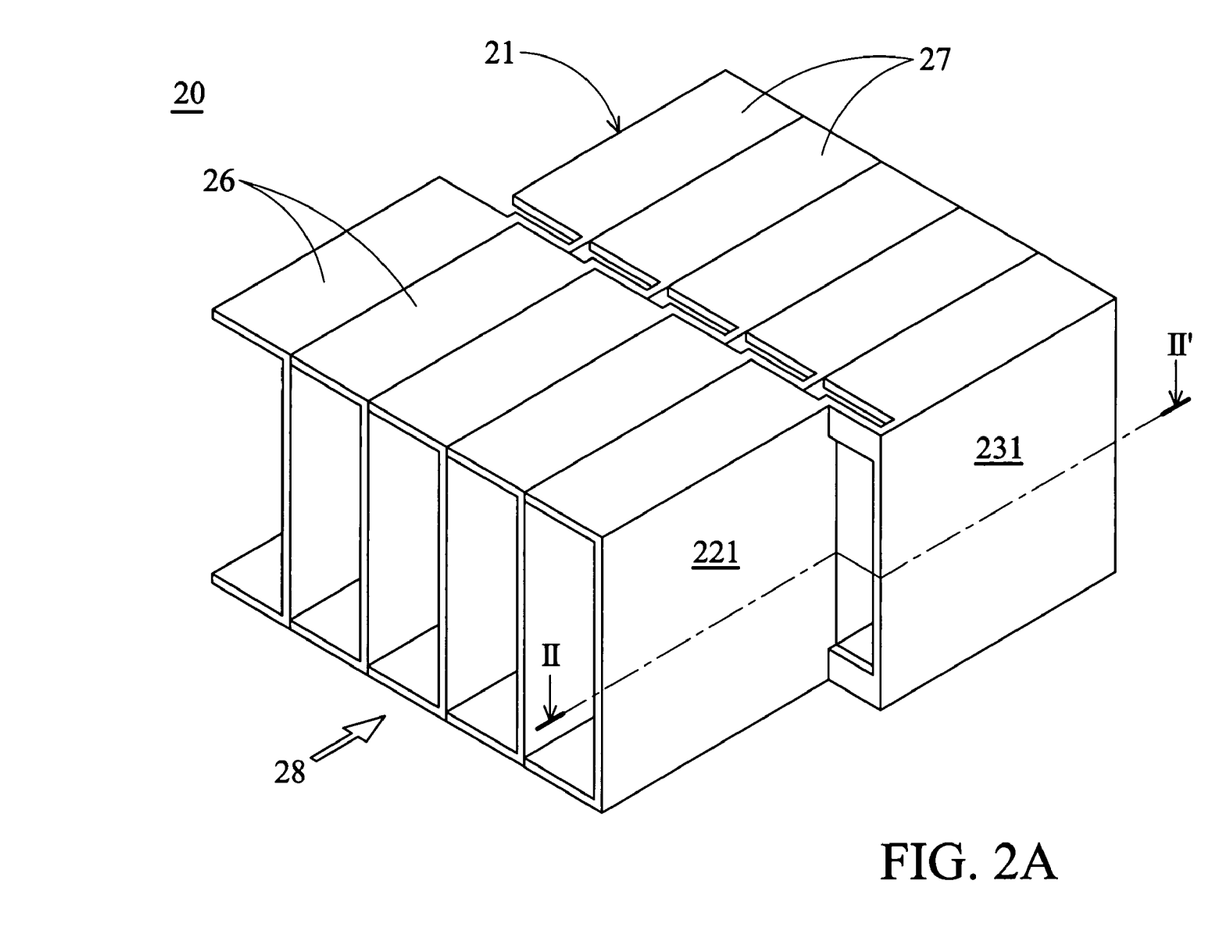
FIG. 2A is a schematic diagram of a heat dissipation device of the invention.

FIG. 2A shows an exemplary embodiment of a heat dissipation device 20 comprising a plurality of heat dissipation fins 21. The heat dissipation device 20 is mounted on a heat source (not shown) to dissipate heat therefrom.

Figure 2B:
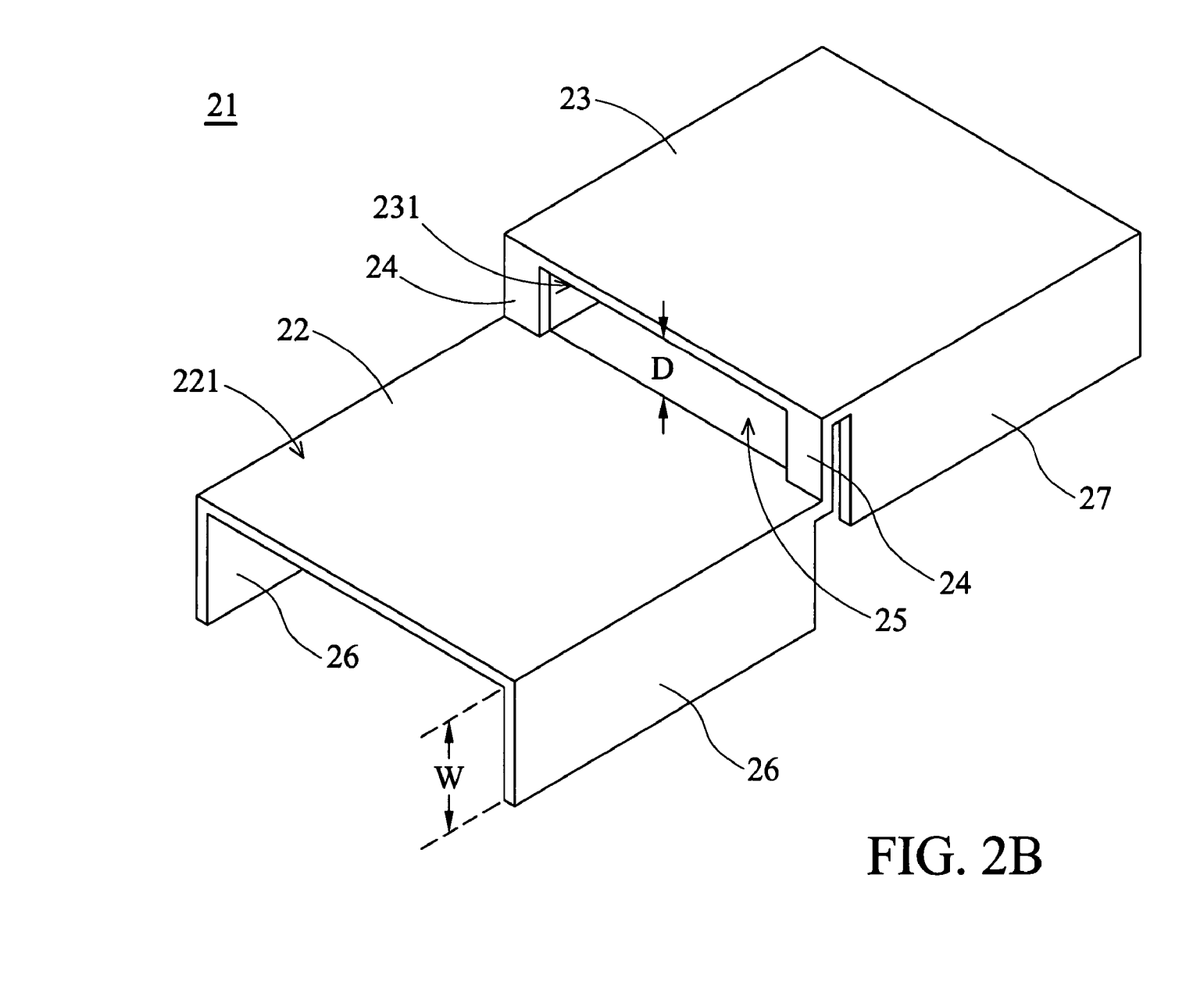
FIG. 2B is a schematic diagram of a heat dissipation fin in a heat dissipation device of the invention.

FIG. 2B shows a single heat dissipation fin 21. The heat dissipation fin 21 comprises a first section 22, a second section 23, and a connecting portion 24 connecting the first section 22 and the second section 23. The first section 22 has a first surface 221 and the second section 23 has a second surface 231 parallel thereto. The connecting portion 24 extends along a normal direction of the first surface 221 (also the second surface 231). An air passage 25 such as an opening is formed on the connecting portion 24 and between the first section 22 and the second section 23. Thus, air passes sequentially through the first surface 221, the air passage 25 and the second surface 231.

Referring to FIGS. 2A and 2B, two first flanges 26 respectively connect to both sides (fringes) of the first section 22 and are substantially perpendicular to the first surface 221. Two second flanges 27 are respectively connected to both sides (fringes) of the second section 23 and are substantially perpendicular to the second surface 231. Several heat dissipation fins 21 are arranged along the normal direction of the first surface 221 and connected to form the heat dissipation device 20 as shown in FIG. 2A. Meanwhile, the first flanges 26 connect the first surface 221 of the adjacent heat dissipation fin 21, and the second flanges 27 connect the second surface 231 of the adjacent heat dissipation fin 21.

After the heat dissipation fins 21 are assembled to the heat dissipation device 20, the first flanges 26 and second flanges 27 respectively form a plane, directly or indirectly connecting a heat source. Heat from the heat source is conducted to the heat dissipation fin 21, and a fan (not shown) is employed to dissipate the heat. The number of heat dissipation fins 21 varies with demand, for example, with the size of the heat source, efficiency required, and the limited space.

Still referring to FIG. 2B, a distance D is formed between the first surface 221 and the second surface 231. The first flanges 26 and the second flanges 27 respectively have a width W. The width W exceeds the distance D. For example, the width W may be twice distance D, generating the profile shown in FIG. 2A.

Conversely, the first flanges 26 and the second flanges 27 may have different widths to generate other profiles.

Figure 2C:
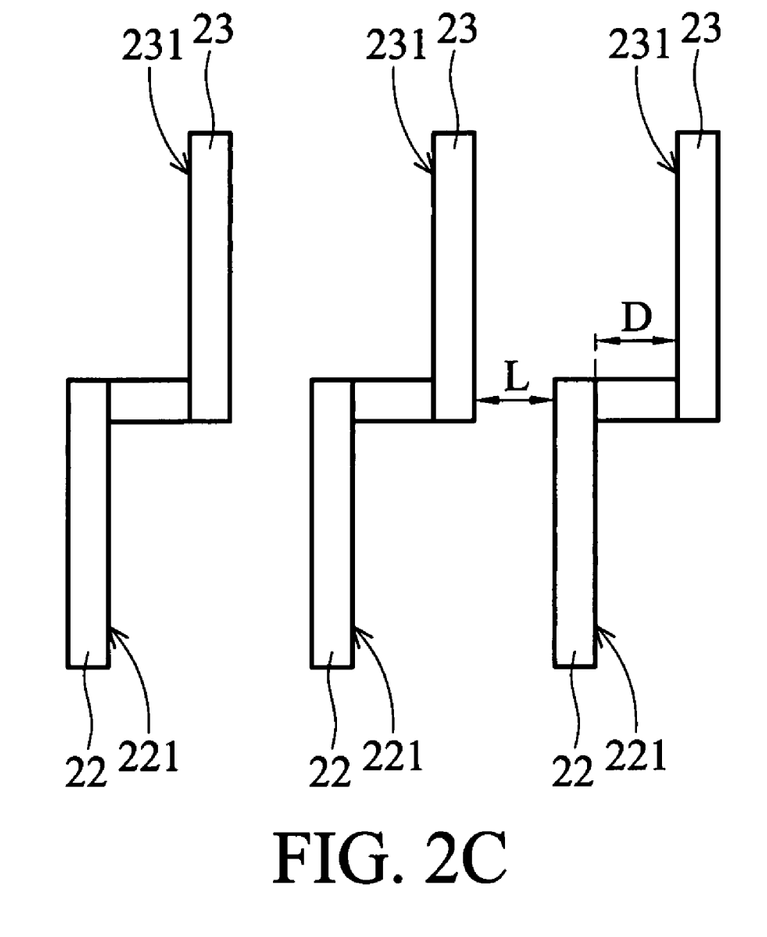
FIG. 2C is a cross section along II–II' line of FIG. 2A.

FIG. 2C is a sectional view of the heat dissipation device 20 along the line II–II'. For convenience, the flanges are omitted in FIG. 2C. In FIG. 2C, the distance D is formed between the first surface 221 and the second surface 231, and a minimum distance L is formed between two heat dissipation fins 21. In a preferable embodiment, the distance D and the minimum distance L are both 1.0 mm to satisfy the standard, preventing entry of foreign material.

As mentioned, the number of heat dissipation fins 21 of the invention is half that of the conventional one. For example, if the length of a heat dissipation device is 20 mm, only ten heat dissipation fins of the invention are needed. Thus, the heat dissipation device of the invention decreases the overall weight and the air resistance.

Figure 3A:
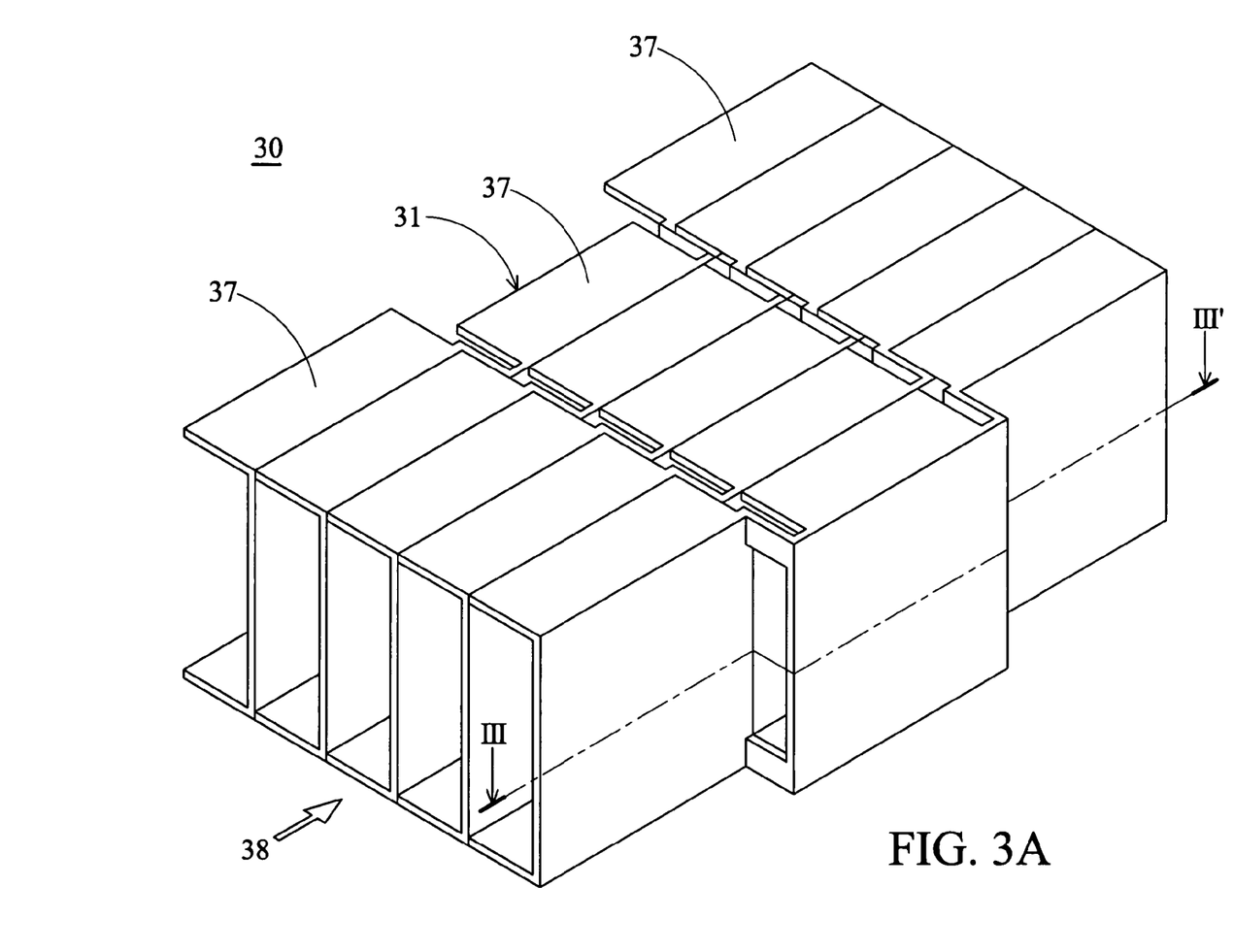
FIG. 3A is a schematic diagram of a heat dissipation device of the invention.

FIG. 3A shows an exemplary embodiment of a heat dissipation device 30 comprising a plurality of heat dissipation fins 31.

Figure 3B:
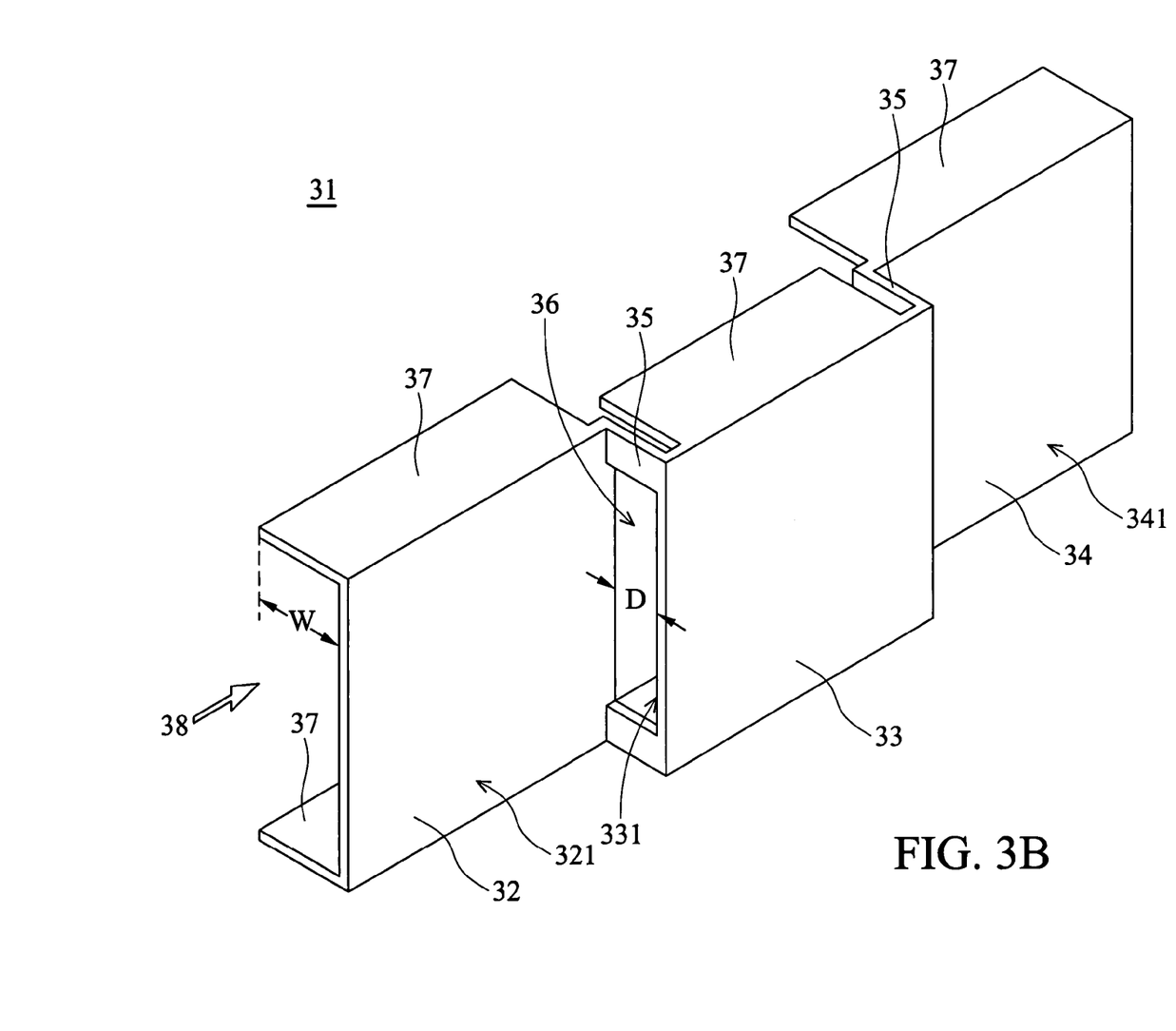
FIG. 3B is a schematic diagram of a heat dissipation fin in a heat dissipation device of the invention.

FIG. 3B shows a single heat dissipation fin 31. The heat dissipation fin 31 comprises a first section 32, a second section 33, a third section 34 and connecting portions 35 respectively connecting the first section 32 and the second section 33 and the second section 33 and the third section 34. The first section 32 has a first surface 321, the second section 33 has a second surface 331, and the third section 34 has a third surface 341. The first surface 321, the second surface 331 and third surface 341 are parallel to each other. The connecting portions 35 extend along a normal direction of the first surface 321 (also the second surface 331 and the third surface 341). An air passage 36 such as an opening is formed on the connecting portions 35 and between the first section 32 and the second section 33. Air passes sequentially through the first surface 321, the air passage 36 and the second surface 231. Similarly, an air passage 36 such as an opening is formed on the connecting portions 35 and between the second section 33 and the third section 34. Air passes sequentially through the second surface 331, the air passage 36 and the third surface 341.

Referring to FIGS. 3A and 3B, flanges 37 connect to both sides (fringes) of the first section 32, the second section 33 and the third section 34 and are substantially perpendicular to the first surface 321. Several heat dissipation fins 31 are arranged along the normal direction of the first surface 321 and connected to form the heat dissipation device 30 shown in FIG. 3A.

After the heat dissipation fins 31 are assembled to the heat dissipation device 30, the flanges 37 are connected to form a plane, directly or indirectly connecting a heat source. Heat from the heat source is conducted to the heat dissipation fin 31, and a fan (not shown) is employed to dissipate the heat. The number of heat dissipation fin 31 varies with demand, for example, with the size of the heat source, efficiency required, and the limited space.

Still referring to FIG. 3B, a distance D is formed between the first surface 321 and the second surface 331, and a distance D' (not shown) is formed between the second surface 331 and the third surface 341. The flanges 37 have width W, exceeding the distance D or the distance D'. For example, the width W may be twice distance D or the distance D', generating the profile shown in FIG. 3A.

Conversely, the distance D and the distance D' may be different, as may be the width of the flanges connected to the first section 32, the second section 33 and the third section 34 to generate other profiles.

Figure 3C:
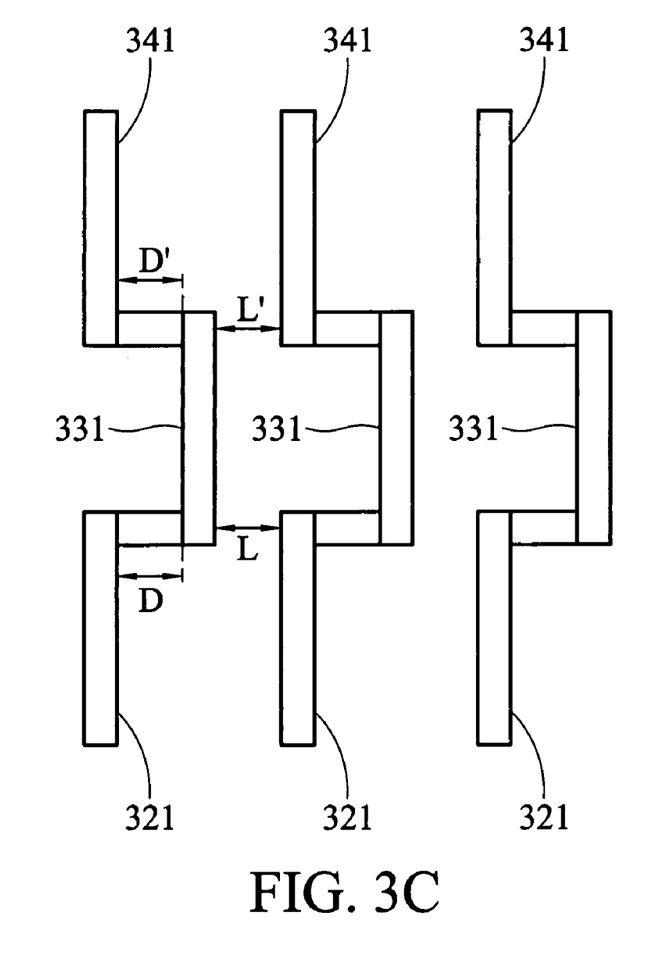
FIG. 3C is a cross section along III–III' line of FIG. 3A.

FIG. 3C is a sectional view of the heat dissipation device 30 along the line III–III'. For convenience, the flanges are omitted in FIG. 3C. In FIG. 3C, the distance D is formed between the first surface 321 and the second surface 331, the distance D' is formed between the second surface 331 and the third surface 341, and a minimum distance L (namely, the distance between the second surface 331 of a first heat dissipation fin and the first surface 321 of a second heat dissipation fin) and a minimum distance L' (namely, the distance between the second surface 331 of a first heat dissipation fin and the third surface 341 of a second heat dissipation fin) are formed between two heat dissipation fins 31. In a preferable embodiment, the distance D, distance D', the minimum distance L and the minimum distance L' are 1.0 mm to satisfy the standard, preventing entry of foreign material.

As mentioned, the number of heat dissipation fins 31 of the invention is half that of the conventional one. For example, if the length of a heat dissipation device is 20 mm, only ten heat dissipation fins of the invention are needed. Thus, the heat dissipation device of the invention decreases the overall weight and the air resistance.

The heat dissipation fin disclosed has two or three sections, while it is to be understood that this is an example and is not limited to the disclosed embodiments. The heat dissipation fin may have four, five or more sections as needed.

The connection of the heat dissipation fin may be adhered by adhesive, connected by corresponding connecting portions or engaged by corresponding engaging portions.

While the invention has been described by way of example and in terms of preferred embodiment, it is to be understood that the invention is not limited thereto. On the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A heat dissipation fin, comprising:
   a first section having a first surface;
   a second section having a second surface parallel to the first surface, wherein the first surface and the second surface are at different levels; and
   a connecting portion connecting the first and the second sections, wherein an air passage is formed on the connecting portion and between the first section and the second section so that an air passes sequentially through the first section, the air passage and the second section.

2. The heat dissipation fin as claimed in claim 1, further comprising two connecting portions, wherein an opening is formed between the first section and the second section, and an air passes sequentially through the first section, the opening and the second section.

3. The heat dissipation fin as claimed in claim 1, wherein the connecting portion extends along a normal direction of the first surface.

4. The heat dissipation fin as claimed in claim 1, further comprising two flanges respectively connected to the first and second sections.

5. The heat dissipation fin as claimed in claim 4, wherein a distance extends along the normal direction of the first surface between the first and second surfaces, and each flange has a width, exceeding the distance.

6. The heat dissipation fin as claimed in claim 5, wherein the width is twice the distance.

7. The heat dissipation fin as claimed in claim 4, wherein the flanges are substantially perpendicular to the first surface.

8. A heat dissipation fin, comprising:
   a first section having a first surface;
   a second section having a second surface;
   a third section having a third surface parallel to the first and the second surfaces;
   a first connecting portion connecting the first and the second sections and extending along a normal direction of the first surface, wherein a first air passage is formed on the first connecting portion and between the first section and the second section; and
   a second connecting portion connecting the second and third sections and extending along the normal direction of the first surface, wherein a second air passage is formed on the second connecting portion and between the second section and the third section, so that an air passes sequentially along the first surface, through the first air passage, along the second surface, through the second air passage and along the third surface.

9. The heat dissipation fin as claimed in claim 8, further comprising a plurality of flanges respectively connected to the first, the second and the third sections.

10. A heat dissipation device, comprising:
    a plurality of heat dissipation fins, wherein each fin comprises:
    a first section having a first surface;
    a second section having a second surface parallel to the first surface; and
    a connecting portion connecting the first and the second sections and extending in a normal direction of the first surface, wherein an air passage is formed between the first section and the second section so that an air passes sequentially through the first section, the air passage and the second section.

11. The heat dissipation device as claimed in claim 10, wherein the heat dissipation fins are connected along the normal direction of the first surface.

12. The heat dissipation device as claimed in claim 10, wherein each heat dissipation fin further comprises two connecting portions, an opening is formed between the first section, the second section and the connecting portions, and an air passes sequentially through the first section, the opening and the second section.

13. The heat dissipation device as claimed in claim 10, wherein each heat dissipation fin further comprises four flanges respectively connected to the first and second sections.

14. The heat dissipation device as claimed in claim 13, wherein a distance extends along the normal direction of the first surface between the first and second surfaces, and each flange has a width, exceeding the distance.

15. The heat dissipation device as claimed in claim 14, wherein the width is twice the distance.

16. The heat dissipation device as claimed in claim 13, wherein the flanges are substantially perpendicular to the first surface.

17. The heat dissipation device as claimed in claim 10, wherein each heat dissipation fin further comprises two first flanges and two second flanges, the first flanges are connected to a fringe of the first section, and the second flanges are connected to a fringe of the second section.

18. The heat dissipation device as claimed in claim 17, wherein the first flanges connects to the first surface of the adjacent heat dissipation fin and the second flanges connects to the second surface of the adjacent heat dissipation fin.

* * * * *